(12) United States Patent
Zota et al.

(10) Patent No.: US 11,735,634 B2
(45) Date of Patent: Aug. 22, 2023

(54) COMPLEMENTARY 3D NANOSHEET MATRIX FETS

(71) Applicant: International Business Machines Corporation, Armonk, NY (US)

(72) Inventors: Cezar Bogdan Zota, Ruschlikon (CH); Clarissa Convertino, Rueschlikon (CH); Kirsten Emilie Moselund, Rüschlikon (CH)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 17/203,971

(22) Filed: Mar. 17, 2021

(65) Prior Publication Data

US 2022/0302269 A1 Sep. 22, 2022

(51) Int. Cl.
*H01L 29/417* (2006.01)
*H01L 29/06* (2006.01)
(Continued)

(52) U.S. Cl.
CPC .......... *H01L 29/41766* (2013.01); *H01L 21/823814* (2013.01); *H01L 29/0665* (2013.01); *H01L 29/42392* (2013.01)

(58) Field of Classification Search
CPC .......... H01L 21/02603; H01L 21/8221; H01L 21/823431; H01L 21/823814; H01L 21/823821; H01L 21/845; H01L 27/0688; H01L 27/0886; H01L 27/0924; H01L 27/10879; H01L 27/1211; H01L 29/0665; H01L 29/0669; H01L 29/0673; H01L 29/41766; H01L 29/41791; H01L 29/42392; H01L 29/66439;
(Continued)

(56) References Cited

U.S. PATENT DOCUMENTS 9,508,829 B1  11/2016  Cheng et al.
9,570,609 B2  2/2017   Obradovic et al.
(Continued)

OTHER PUBLICATIONS

C. Convertino et al., "Sub-Thermionic Scalable III-V Tunnel Field-Effect Transistors Integrated on Si (100)," 2019 IEEE International Electron Devices Meeting (IEDM), San Francisco, CA, USA, 2019, pp. 37.1.1-37.1.4, doi: 10.1109/IEDM19573.2019.8993610.
(Continued)

*Primary Examiner* — David C Spalla
(74) *Attorney, Agent, or Firm* — Mark Bergner

(57) ABSTRACT

A method for forming heterogeneous complementary FETs using a compact stacked nanosheet process is disclosed. The method comprises forming a first nanosheet stack comprising two layers of a first channel material separated by a second sacrificial layer, forming over the first nanosheet stack an equivalent second nanosheet stack, wherein the first channel material is complementary to the second channel material. The method comprises further forming a first source region and a first drain region, thereby building a first FET, and forming over the first source region and the first drain region a second source region and a second drain region, thereby building a second FET, removing selectively sacrificial layers, and forming a gate stack comprising a gate-all-around structure around all channels.

18 Claims, 13 Drawing Sheets

(51) Int. Cl.
*H01L 29/423* (2006.01)
*H01L 21/8238* (2006.01)

(58) Field of Classification Search
CPC ........... H01L 29/66795; H01L 29/6681; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 9,647,098 | B2 | 5/2017 | Obradovic et al. |
| 9,755,017 | B1 | 9/2017 | Guillorn et al. |
| 9,960,232 | B2 | 5/2018 | Obradovic et al. |
| 9,991,261 | B2 | 6/2018 | Mitard |
| 10,090,193 | B1 * | 10/2018 | Chanemougame ......................... H01L 21/823821 |
| 10,134,640 | B1 * | 11/2018 | Chiang .............. H01L 29/78651 |
| 10,256,158 | B1 | 4/2019 | Frougier et al. |
| 10,263,075 | B2 | 4/2019 | Bi et al. |
| 10,340,195 | B2 | 7/2019 | Loubet et al. |
| 10,355,085 | B1 | 7/2019 | Huang et al. |
| 10,388,569 | B1 | 8/2019 | Cheng et al. |
| 10,510,622 | B1 * | 12/2019 | Frougier ............. H01L 21/8221 |
| 10,566,330 | B2 | 2/2020 | Rodder et al. |
| 2008/0176366 | A1 | 7/2008 | Mita et al. |
| 2012/0007052 | A1 | 1/2012 | Hobbs |
| 2015/0295084 | A1 | 10/2015 | Obradovic et al. |
| 2016/0020305 | A1 * | 1/2016 | Obradovic .......... H01L 29/7391 438/157 |
| 2017/0040321 | A1 * | 2/2017 | Mitard .................. H01L 29/165 |
| 2017/0323941 | A1 | 11/2017 | Obradovic et al. |
| 2018/0277630 | A1 | 9/2018 | Bi et al. |
| 2019/0097011 | A1 * | 3/2019 | Wu ..................... H01L 27/1248 |
| 2019/0181140 | A1 | 6/2019 | Rodder et al. |
| 2019/0198614 | A1 | 6/2019 | Reboh et al. |
| 2019/0206994 | A1 | 7/2019 | Huang et al. |
| 2020/0043926 | A1 | 2/2020 | Ohtou et al. |
| 2020/0119015 | A1 | 4/2020 | Bi et al. |
| 2020/0365467 | A1 | 11/2020 | Cheng |
| 2021/0184000 | A1 * | 6/2021 | Ramaswamy ...... H01L 27/0688 |

OTHER PUBLICATIONS

Mookerjea, S. et al., "Experimental Demonstration of 100nm Channel Length In0.53Ga0.47As-based Vertical Inter-band Tunnel Field Effect Transistors (TFETs) for Ultra Low-Power Logic and SRAM Applications", Electrical Engineering, the Pennsylvania State University, 1 Materials Science and Engineering, Cornell University, 3 pages, 2009.

Sant, S. et al., "Impact of Non-idealities on the performance of InAs/(In) GaAsSb/GaSb tunnel FETs", 11 pages, Composants nanoélectroniques, 2018.

Elnaggar et al., "A comprehensive investigation of TFETs with semiconducting silicide source: impact of gate drain underlap and interface traps", Semicond. Sci. Technol. vol. 34, No. 4, 4 pages, 2019.

Krishnaraja, A. et al., "Reducing ambipolar off-state leakage currents in III-V vertical nonowire tunnel FETs using gate-drain underlap", App. Phys. Lett. 115, 143505 (2019).

Cutaia, D. et al., "Complementary III-V Heterojunction Lateral NW Tunnel FET Technology on Si", Symposium on VLSI Technology Digest of Technical Papers, 12 pages, Published Date: Jun. 2016.

Lin, J., Antoniadis, D.A., Alamo, J.A., "Sub-30 nm InAs Quantum-Well MOSFETs with Self-Aligned Metal Contacts and Sub-1 nm EOT HfO2 Insulator", Microsystems Technology Laboratories, MIT, 24 pages, Dec. 12, 2012.

Loubet, N. et al., "Stacked Nanosheet Gate-All-Around Transistor to Enable Scaling Beyond FinFET", Conference Paper Jun. 2017, ResearchGate, 3 pages.

V. Saripalli, A. Mishra, S. Datta and V. Narayanan, "An energy-efficient heterogeneous CMP based on hybrid TFET-CMOS cores," 2011 48th ACM/EDAC/IEEE Design Automation Conference (DAC), New York, NY, 2011, pp. 729-734.

Lind, E. et al., III-V Heterostructure Nanowire Tunnel FETs, Journal of the Electron Devices Society, vol. 3, No. 3, May 2015.

Pandey R. et al., Demonstration of p-type In0.7Ga0.3As/GaAs0.35Sb0.65 and n-type GaAs0.4Sb0.6/In0.65Ga0.35As Complimentary Heterojunction Vertical Tunnel FETs for Ultra-Low Power Logic, VLSI, 2 pages, 2015.

IBM, List of IBM Patents or Patent Applications Treated as Related, Mar. 17, 2021, 2 pages.

U.S. Appl. No. 17/204,016, Hybrid Nanoshfft Tunnel-FET/CMOS Technology, filed Mar. 17, 2021.

* cited by examiner

COMPLEMENTARY 3D NANOSHEET MATRIX FETS

BACKGROUND

Described herein is a method for forming heterogeneous complementary FETs, and more specifically, a method for forming heterogeneous complementary FETs using a compact stacked nanosheet process. Further disclosed herein is a stacked nanosheet semiconductor structure of complementary FETs.

Technology development in silicon and other semiconductor technology is developing fast and continues to be in line with Moore's law. Additionally, materials previously considered as not compatible with standard silicon fabrication processes are getting more attention.

SUMMARY

According to one aspect of the present disclosure, a method for forming heterogeneous complementary FETs using a compact stacked nanosheet process may be provided. The method may comprise forming on a first sacrificial layer and over a substrate a first nanosheet stack comprising two layers made of a first channel material separated by a second sacrificial layer, and forming over the first nanosheet stack a second nanosheet stack comprising two layers made of a second channel material separated by a third sacrificial layer, thereby building a nanosheet double stack. A forth sacrificial layer may separate the first and the second nanosheet stack, and the first channel material may be complementary to the second channel material.

Furthermore, the method may comprise forming a first source region and a first drain region, both being in contact with the two layers of a first channel material, thereby building a first FET, and forming, over the first source region and the first drain region, a second source region and a second drain region, both being in contact with the two layers of a second channel material, thereby building a second FET. The second source region may be positioned over the first source region, and the second drain may be positioned over the first drain region.

Additionally, the method may comprise removing selectively the first, the second, the third and the fourth sacrificial layer by an etch process that may be selective to the material of the first channel material and the second channel material, and that is not selective to the first, the second, and the third sacrificial layer, and forming a gate stack comprising a gate-all-around structure around all channels.

According to another aspect of the present invention, a stacked nanosheet semiconductor structure of complementary FETs may be provided. The structure may comprise a first nanosheet stack comprising two layers a first channel material over a substrate, wherein the two channel layers may be surrounded by a gate-all-around structure, a second nanosheet stack over the first nanosheet stack, the second nanosheet stack comprising two layers of a second channel material, thereby building a nanosheet double stack. The first channel material may be complementary to the second channel material.

The structure may also comprise a first source region and a first drain region, both being in contact with the two layers of a first channel material, thereby building a first FET, a second source region over the first source region and a second drain region over the first drain region, respectively, both being in contact with the two layers of a second channel material, thereby building a second FET, and a gate stack comprising the gate-all-around structure around all channels.

DESCRIPTION OF THE DRAWINGS

Various embodiments are described with reference to different subject matter. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject matter, also any combination between features relating to different subject matter, in particular, between features of the method type claims, and features of the apparatus type claims, is considered as to be disclosed within this document.

The aspects defined above and further aspects are apparent from the examples of embodiments to be described hereinafter and are explained with reference to the examples of embodiments, to which the invention is not limited.

Various embodiments are described by way of example only, and with reference to the following drawings.

Figure 1:
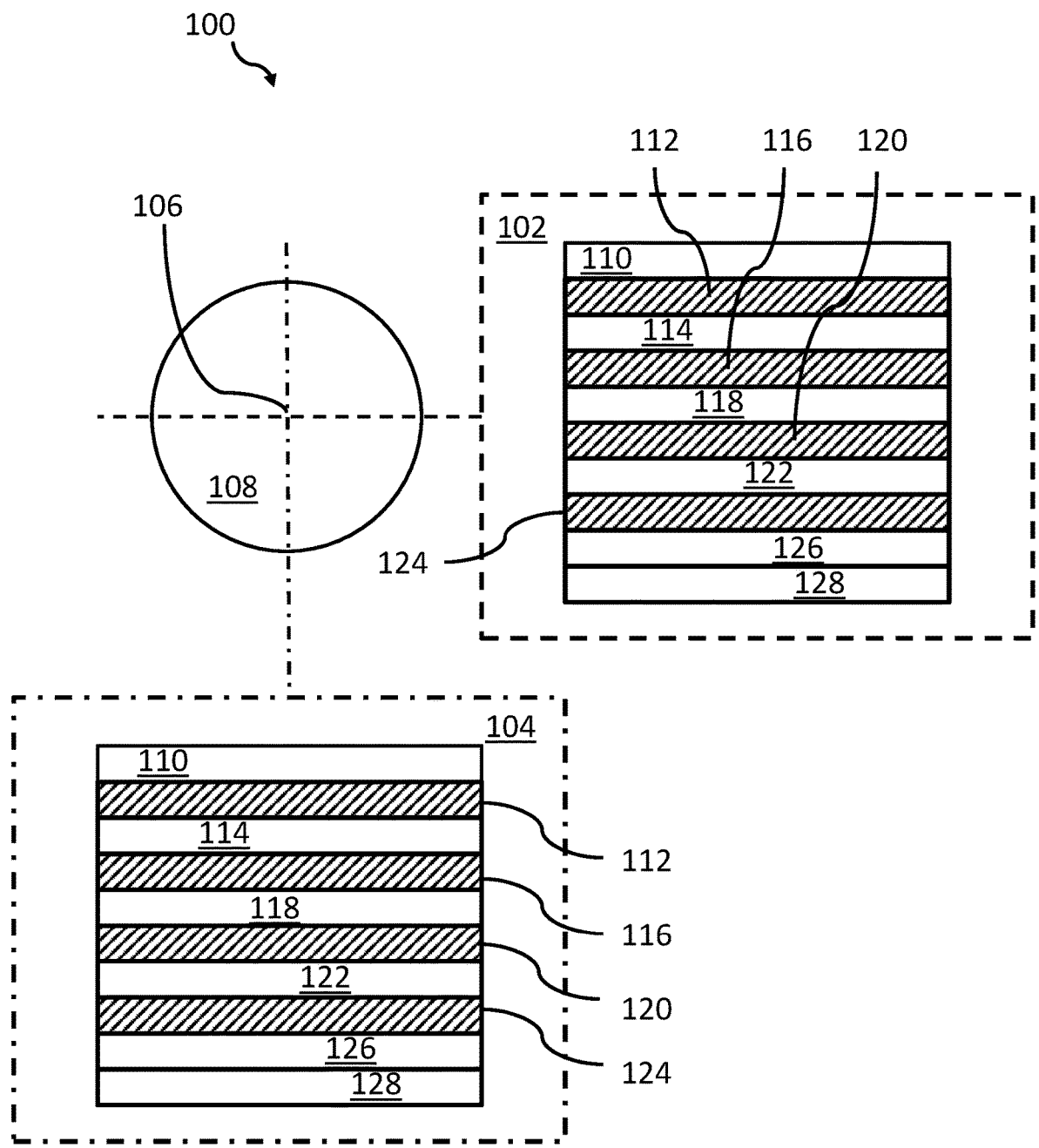

FIG. 1 shows a result of initial method steps of some embodiments of the inventive method for forming heterogeneous complementary FETs using a compact stacked nanosheet process.

Figure 2:
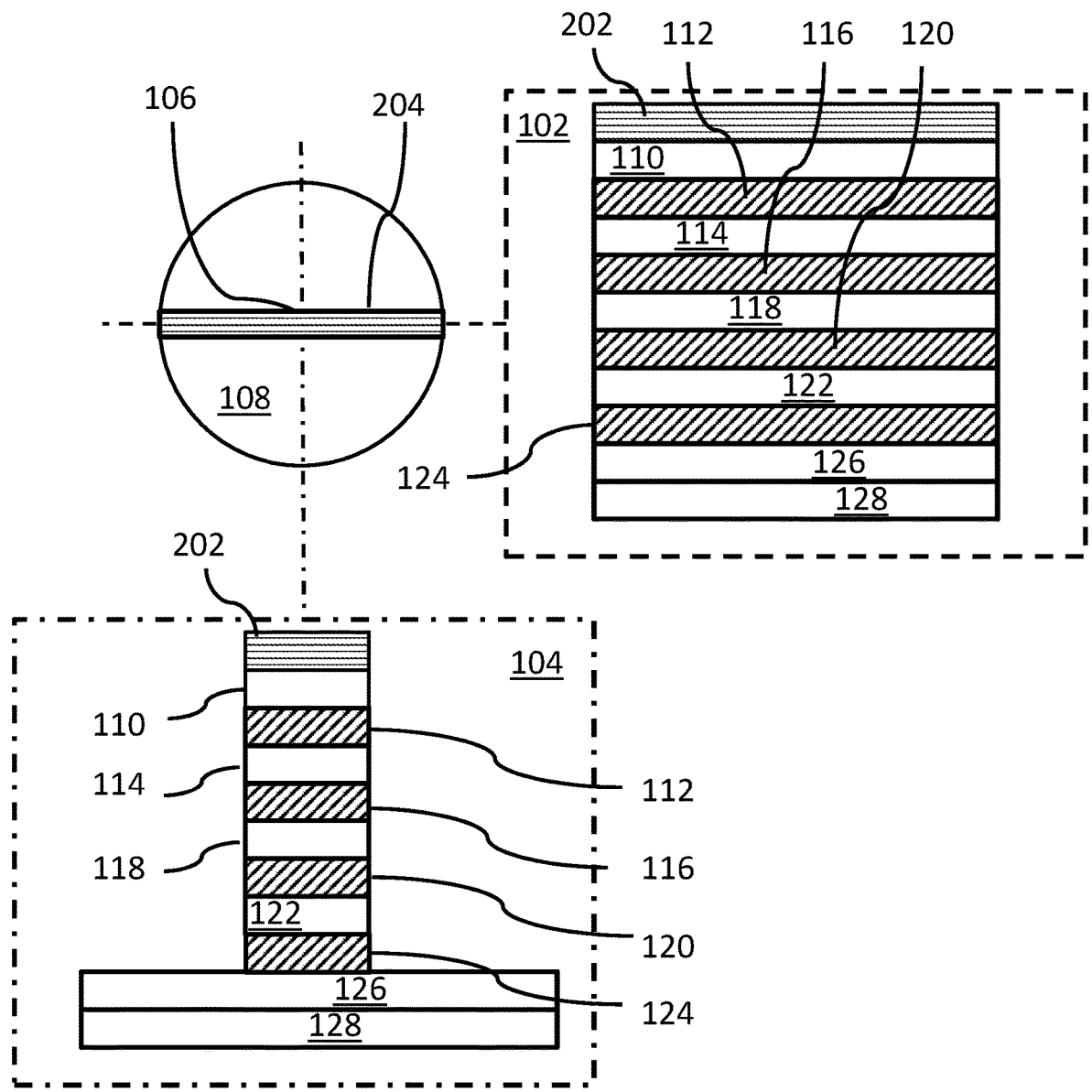
Figure 3:
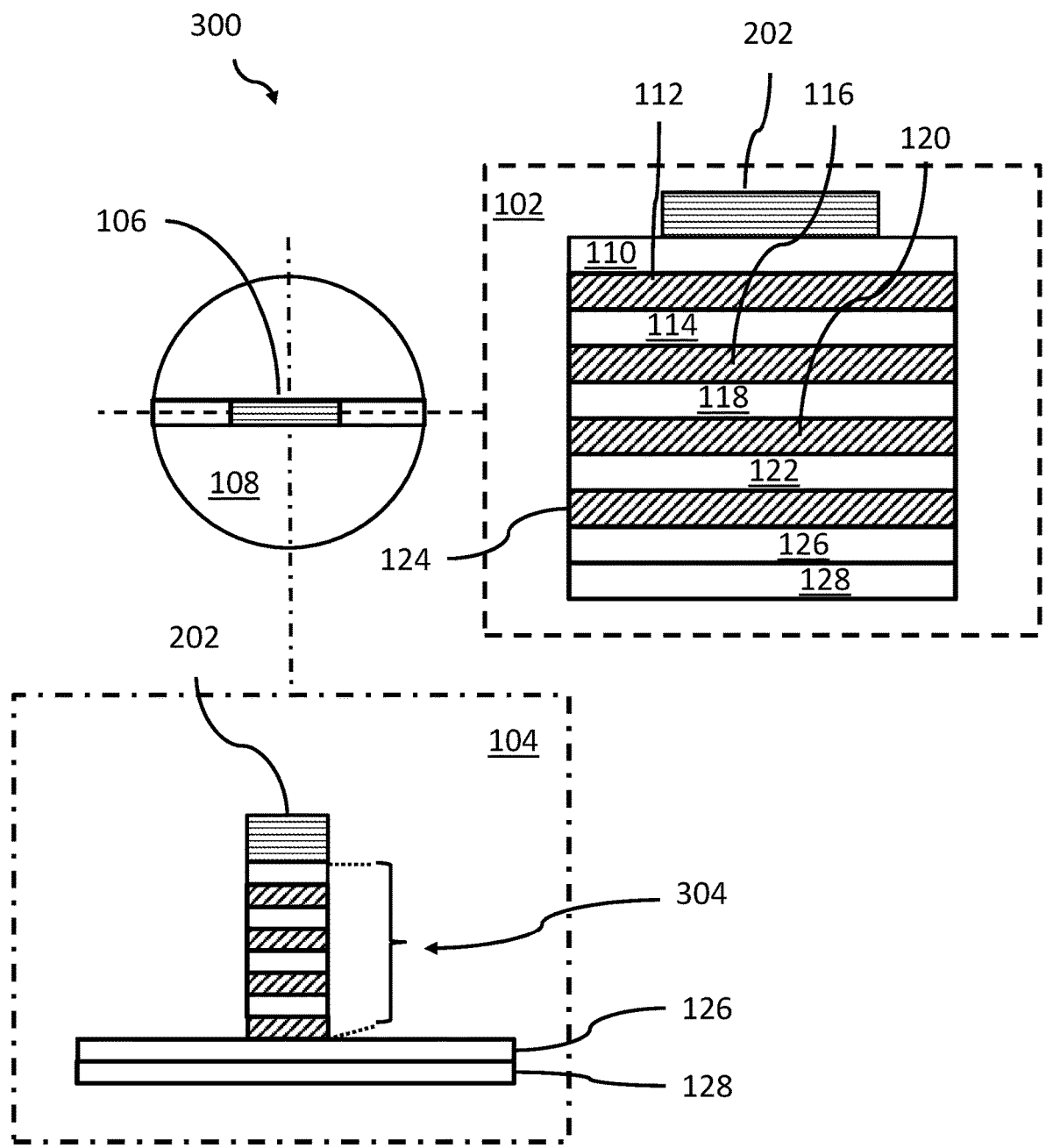

FIGS. 2 and 3 show results of further process or method steps according to some embodiments of the method.

Figure 4:
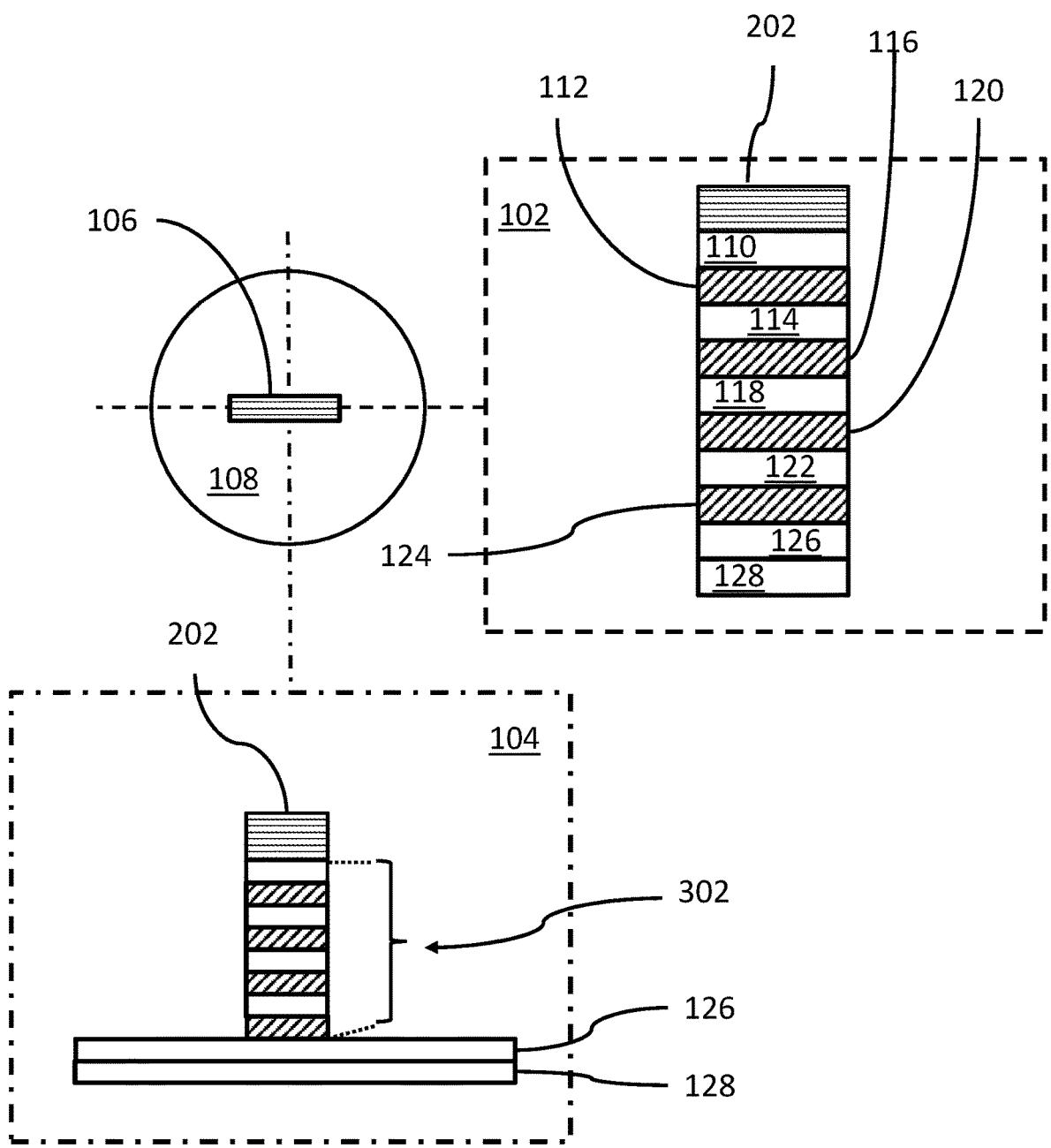

FIG. 4 shows an intermediate result of a method or process step according to some embodiments of the method, in particular a pillar of the nanosheet double stack.

Figure 5:
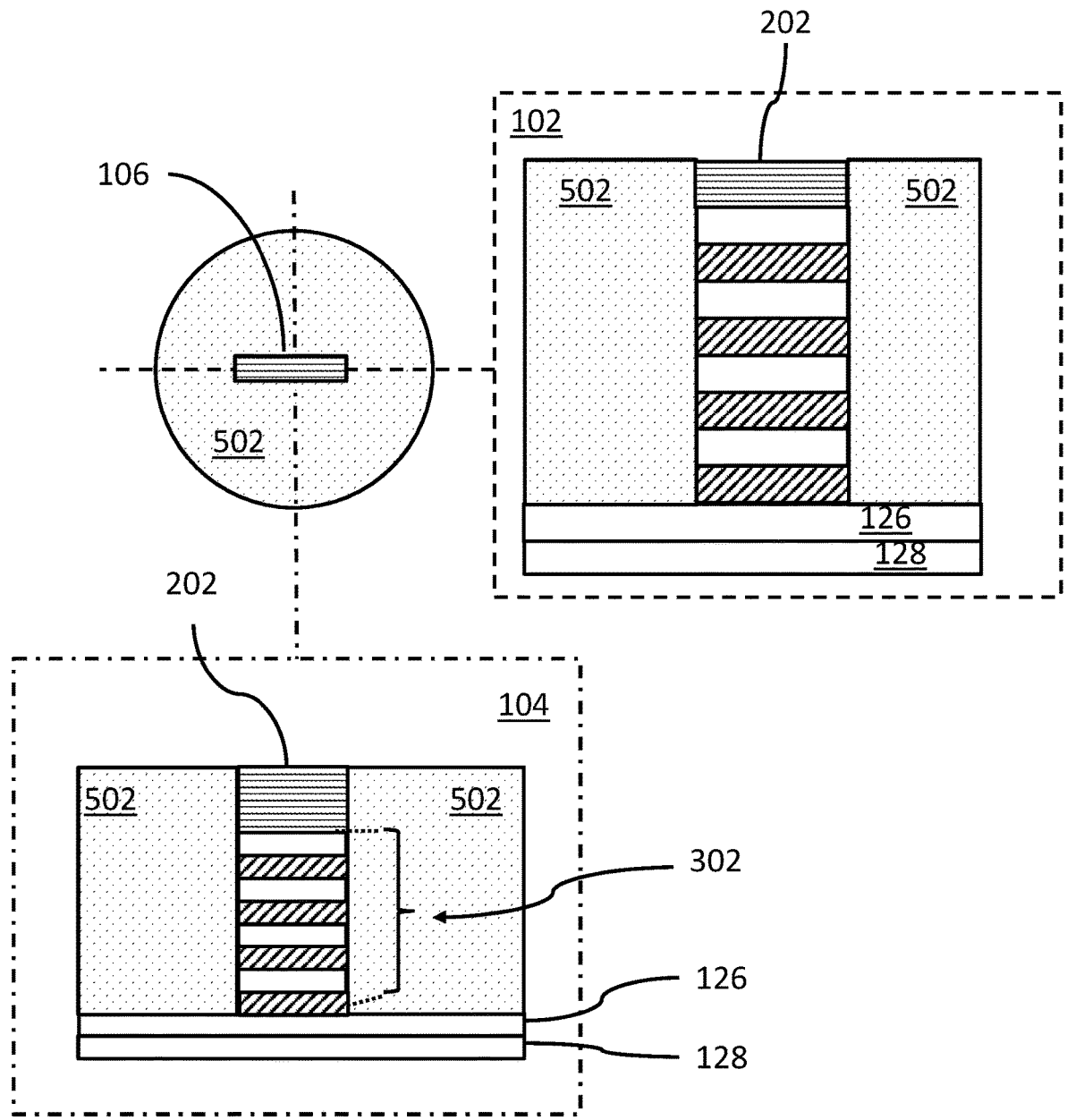

FIG. 5 shows some embodiments of covering the nanosheet double stack with a dielectric.

Figure 6:
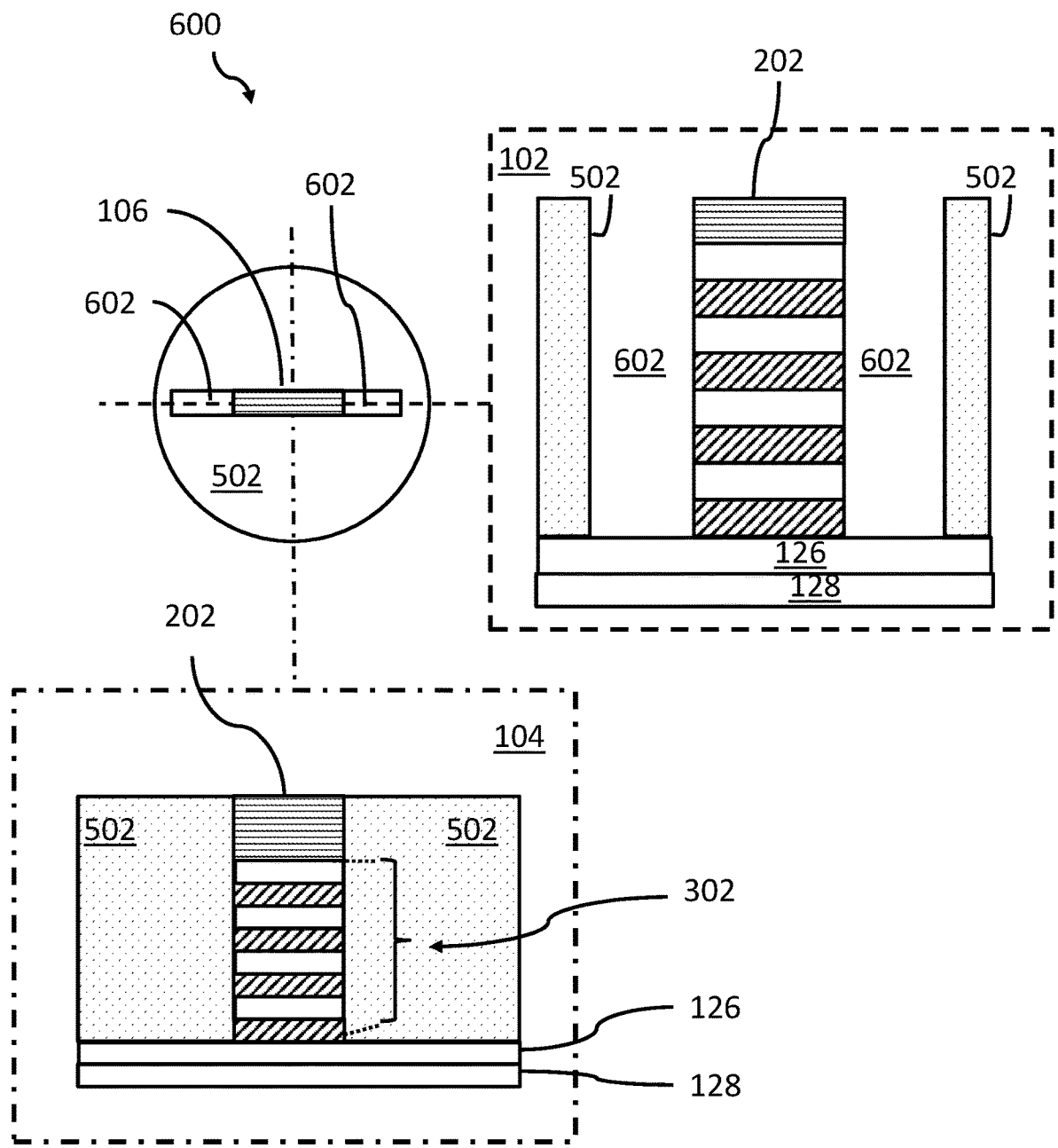

FIG. 6 shows some embodiments of building trenches on sides of the nanosheet double stack.

Figure 7:
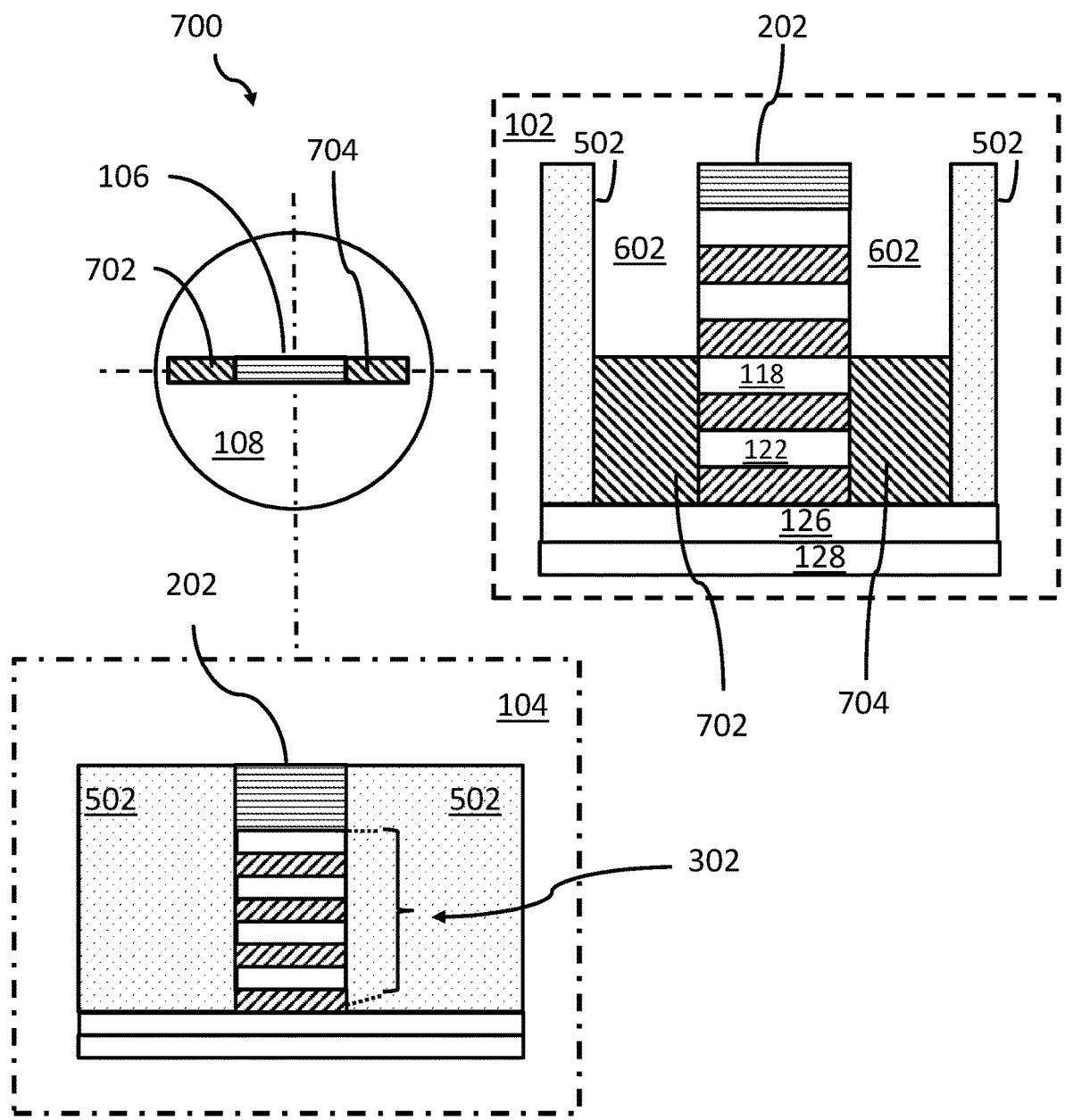

FIG. 7 shows some embodiments of building first a source and a first drain for the first nanosheet stack.

Figure 8:
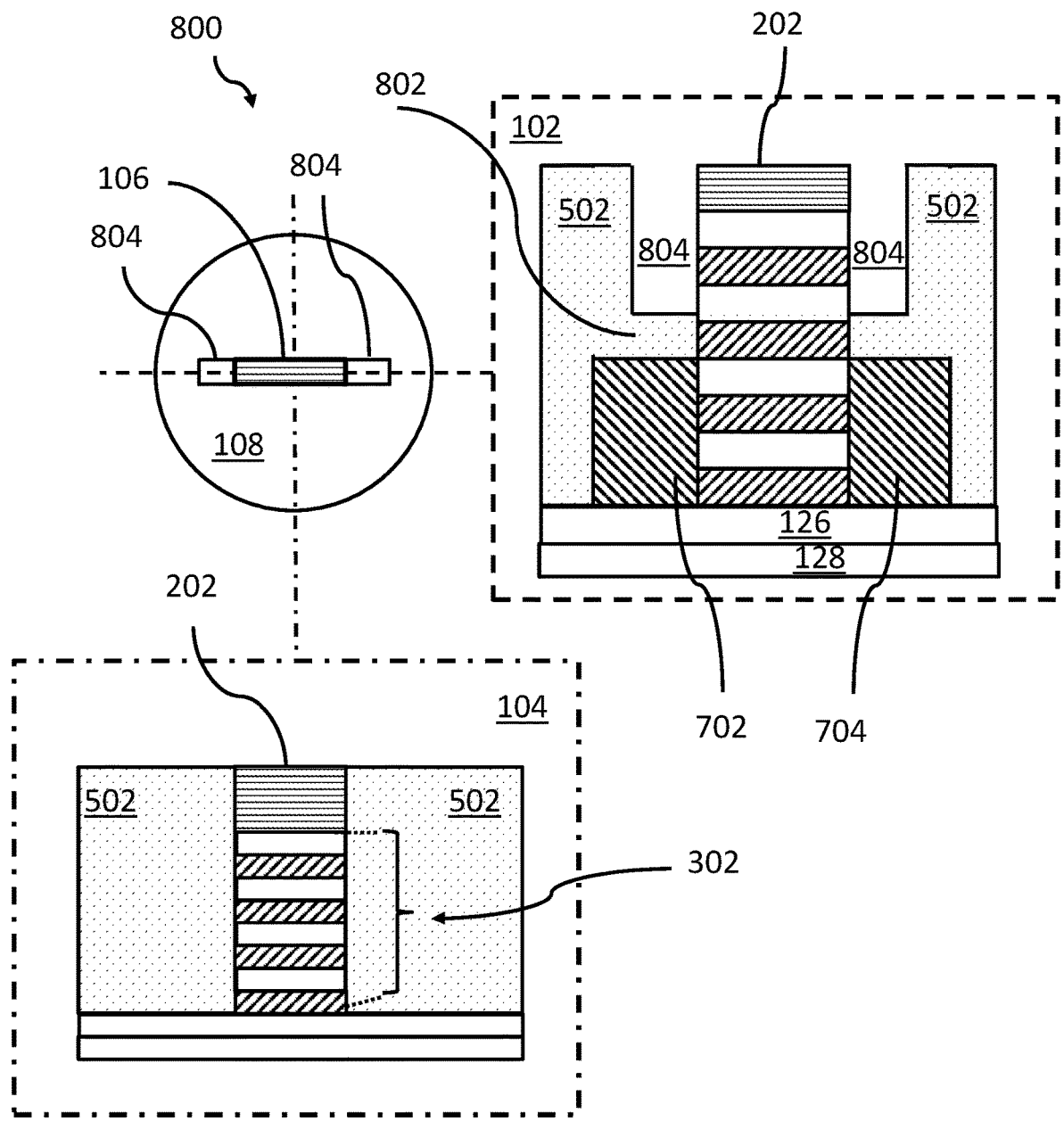

FIG. 8 shows some embodiments of building a dielectric layer over the first source and the first drain.

Figure 9:
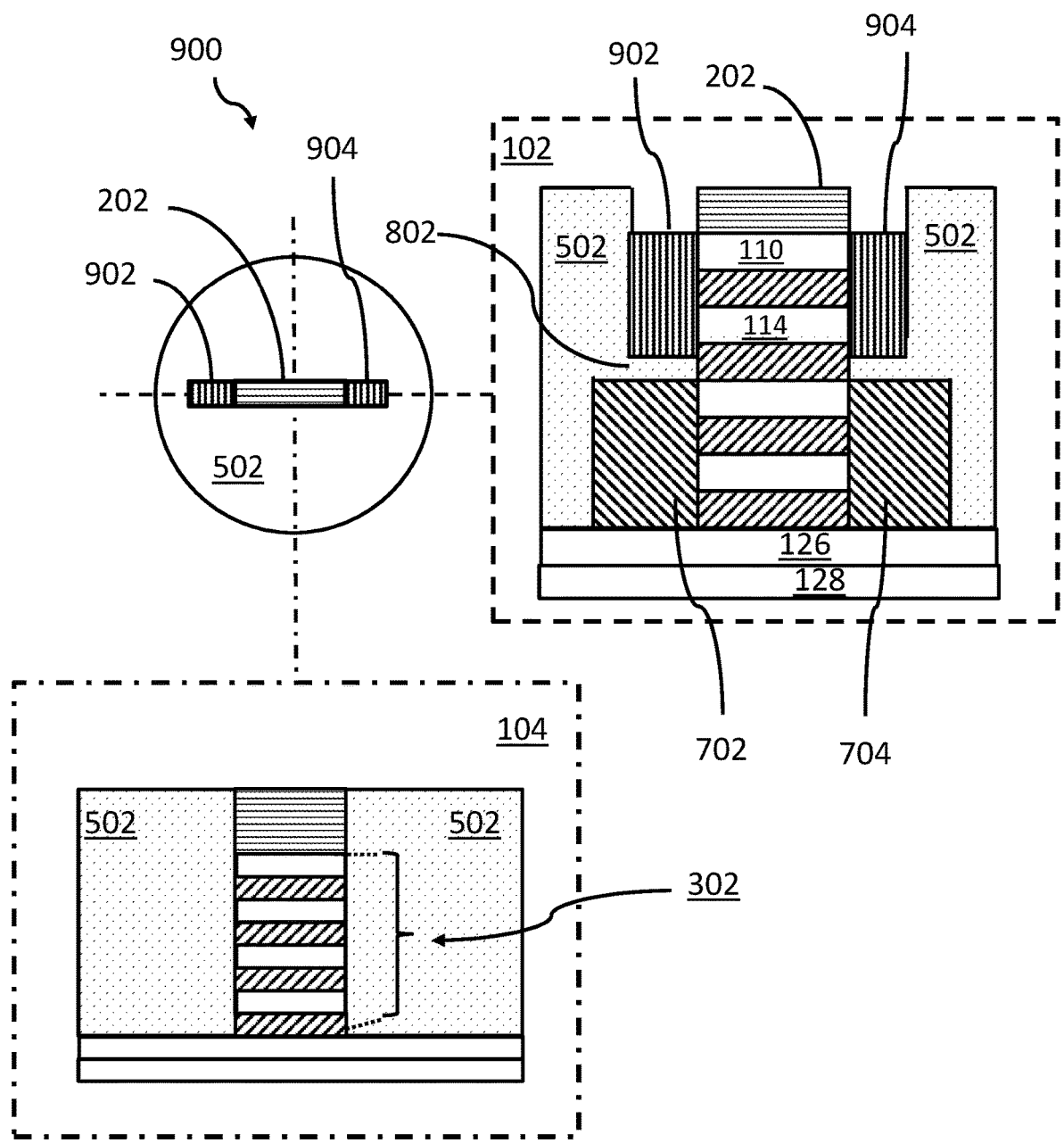

FIG. 9 shows some embodiments of building second source and a second drain over the dielectric layer for the second nanosheet stack.

Figure 10:
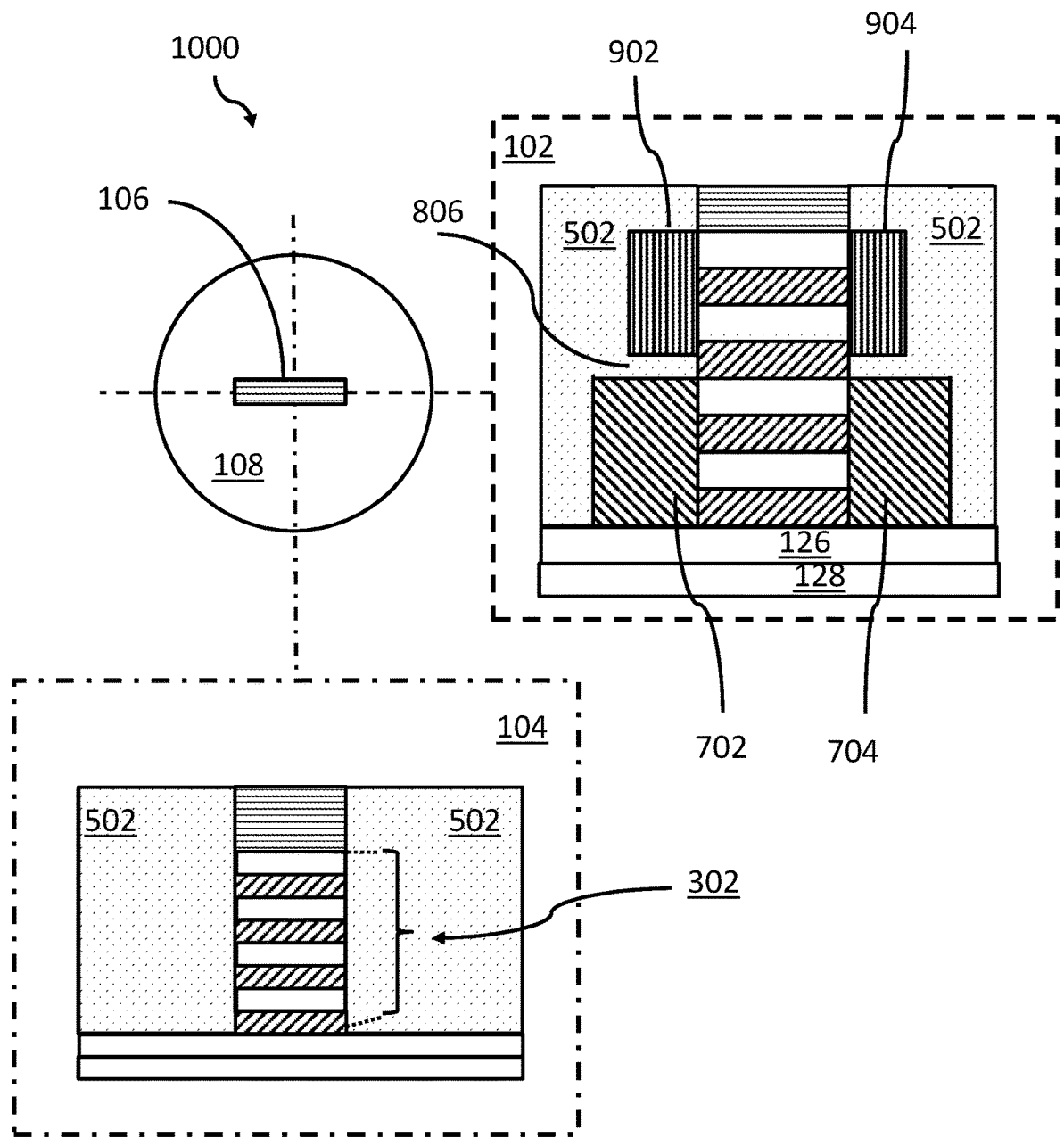

FIG. 10 shows some embodiments of closing the dielectric over the second source and the second drain.

Figure 11:
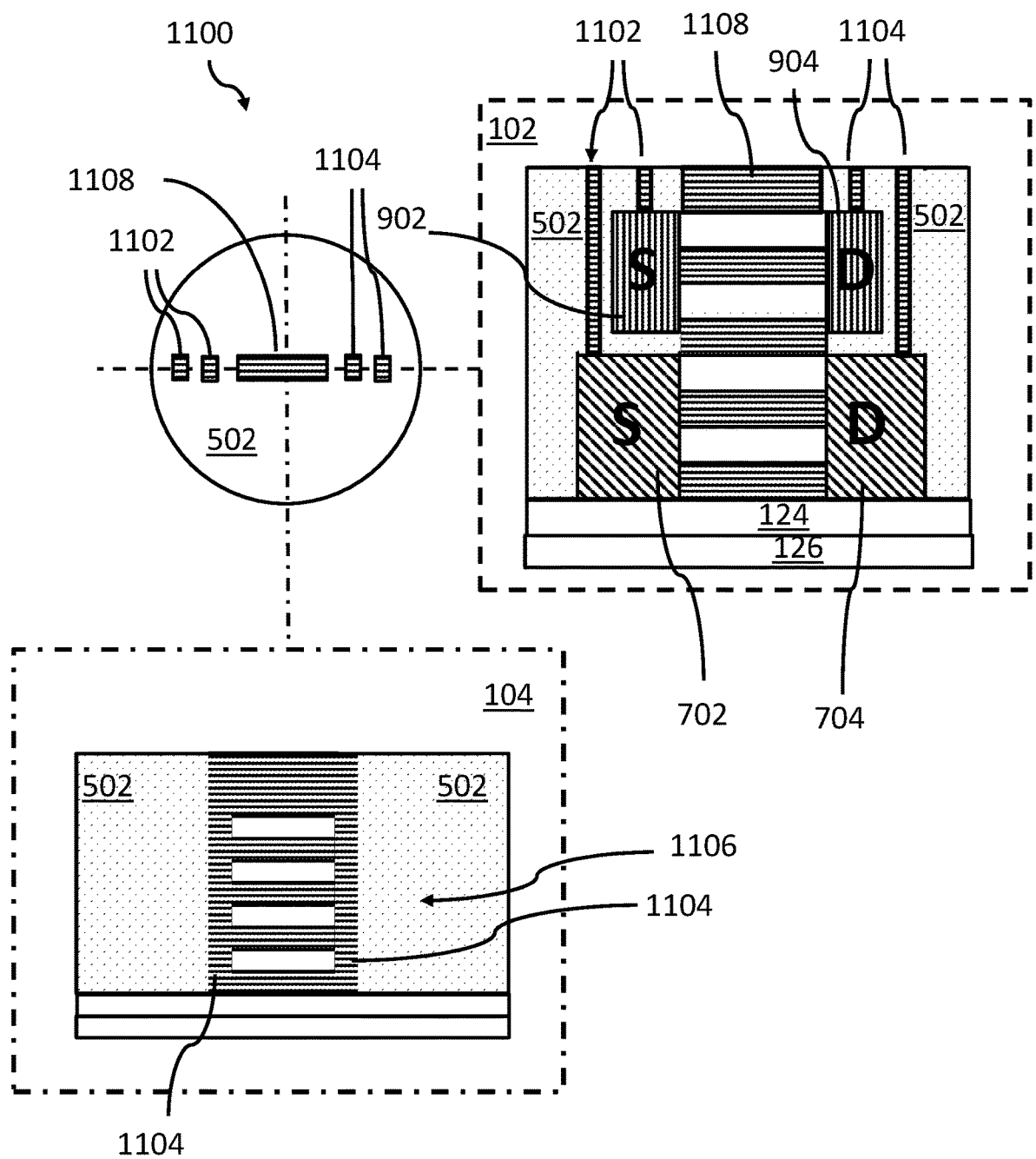

FIG. 11 shows some embodiments of a removal of the sacrificial layers and replacing it by a gate stack.

Figure 12:
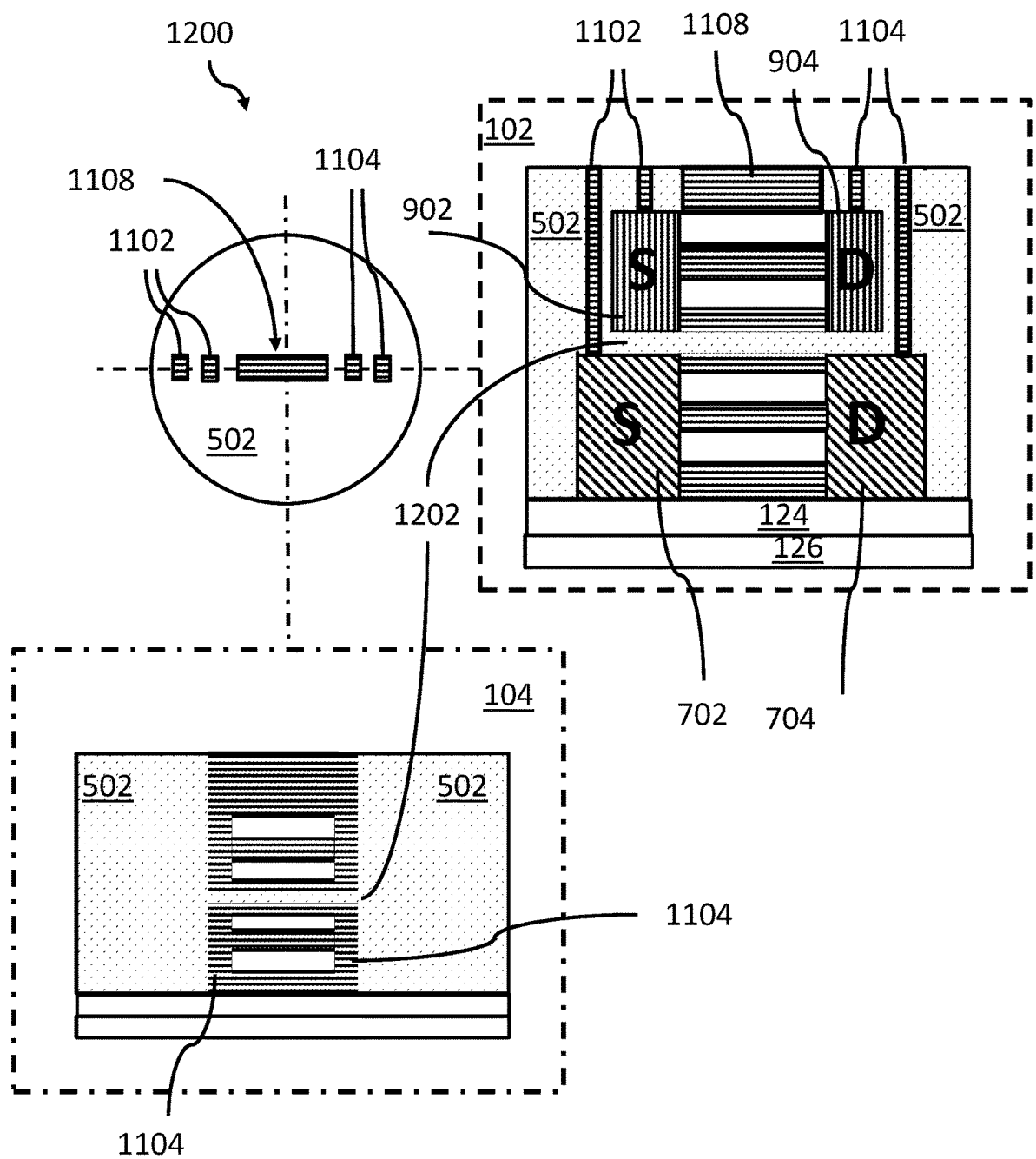

FIG. 12 shows another embodiment in which two gate stacks are implemented.

Figure 13:
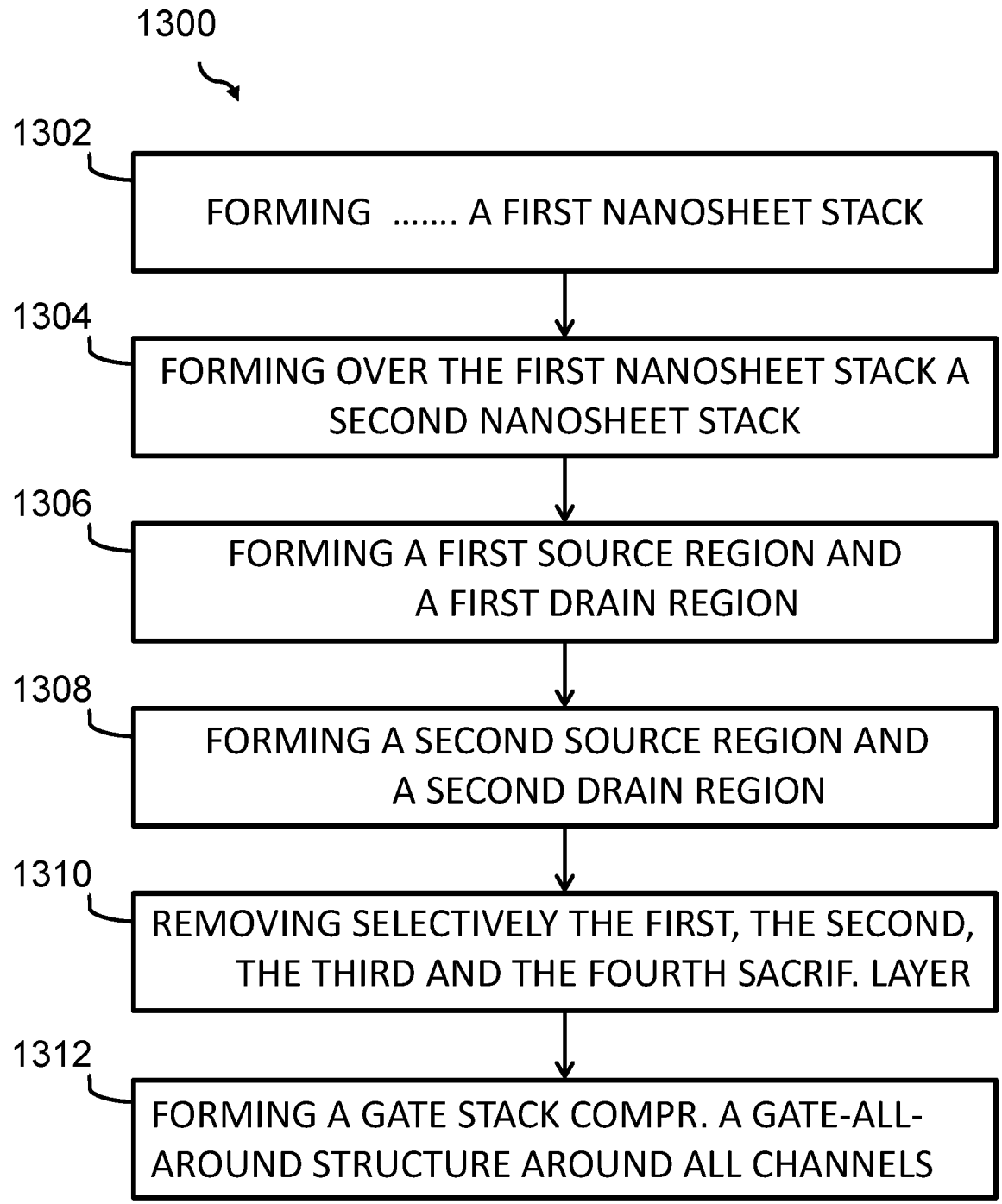

FIG. 13 shows a flow of some embodiments of the inventive method for forming heterogeneous complementary FETs using a compact stacked nanosheet process.

DETAILED DESCRIPTION

In the context of this description, the following conventions, terms and/or expressions may be used:

The term "heterogeneous" may denote that different active material may be used for the channels of two different FETs.

The term "complementary" may denote that in the same device structure—i.e., to stacked FETs—one of the FETs is a p-FET and the other one is an n-FET transistor.

The term "FET" may denote the well-known structure of a field-effect transistor comprising a channel and a capacitively coupled gate.

The term "tunnel FET" or TFET may denote the well-known structure of a field-effect transistor based on the tunneling process and particularly suited for ultra-low power, the TFET comprising a different material for the source and drain.

The term "nanosheet process" may denote a fabrication process—as described herein—using ultra-thin layers of active and/or passive materials with the thickness each ranging from 1 to 100 nm. That sheet-like layer may be seen as a nearly 2-dimensional nano-structure. It is a technique often used for device structures in the range of 5 nm and below.

The term "sacrificial layer" may denote a layer (or more) in the fabrication process of a more complex semiconductor device that may no longer be available in the final device. It may only be used as an intermediate layer in parts of the fabrication process. In the proposed fabrication process, at least the separation layers between the active channel layers are denoted as sacrificial layers because they are replaced—in particular to the end of the fabrication process—by a metal gate structure in a gate-all-around manner.

The term "first nanosheet stack"—as well as the second menu sheet stack—may denote a layered structure of at least two layers of channel material separated by a dielectric material. It may, for example, be InP.

The term "first channel material"—as well as the second channel material—may denote the material building the channel(s) structures of the first nanosheet stack. It may comprise materials like $In_{1-x}Ga_xIn$, GaN, InP, InGaSB, InAs, $GaAs_xSb_{1-x}$. However, the first and second channel material may be different, in particular, heterogeneous.

The term "second sacrificial layer" may denote a layer separating two layers of channel material of the first nanosheet stack.

The term "nanosheet double stack" may denote two (base) nanosheet stacks positioned one over the other and separated by an isolating layer.

The term "complementary" may denote that transistors of different channel material—in particular, n-doped vs p-doped or of different III-V materials—may be used for two related transistors.

The term "source region" may denote here one of the two contacts of a field-effect transistor.

The term "drain region" may denote here the other one of the contacts—apart from the gate contact—of the field effect transistor.

The term "FET" may denote a consistent structure comprising a source and a gate contact as well as a capacitively coupled gate contact.

The term "second source region" may denote a source region for the second, upper FET in the stacked structure of two FETs.

The term "being selective"—in particular "selective in terms of an etch process"—may denote that a material is not etched by an etching solution or process. In this sense, etch-wise being "not selective" may denote the opposite of etch-wise being selective.

The term "gate stack" may denote interconnected layers of gate material, e.g., metal-like conductive material separated from the semiconducting channels by a gate dielectric, usually a thin oxide such as $SiO_2$, $HfO_2$ or $Al_2O_3$ or combinations thereof, such that the stack is enabled to function as capacitively coupled gate in a FET.

The term "gate-all-around" may denote a gate stack structure as defined above structure surrounding a channel structure in a channel-FET structure. The gate may be designed to not only influence the active channel from one side but from all around the channel structure. This may have a higher efficiency in influencing the conductivity of the channel structure.

The term "dielectric layer" may denote an isolating layer such as an oxide or an isolating semiconductor structure.

The term "active material" may denote material in a semiconductor structure comprising free carriers. E.g., the channel structure or source and drain may be denoted as active material.

Technology development in silicon and other semiconductor technology is developing fast and continues to be in line with Moore's law. The known standard FinFET processes are stepwise replaced by horizontal nanosheet technologies. Businesses in the semiconductor industry more and more focus on vertically stacked fin/sheet technologies for future scaled technology nodes. This has an influence but is also influenced by the logic gate roadmap for low-power electronics with compact designs and increasing area density gain.

Additionally, materials previously considered as not compatible with standard silicon fabrication processes get more attention because of the direct bandgap which may enable integrated laser sources integrated with standard silicon devices for photonic applications. Because of the higher carrier mobility and smaller bandgaps of some III-V semiconductors, the power consumption of such devices may be reduced significantly. Thus, despite the difficulties in the fabrication process, nanosheet technologies—or in other words, "horizontally stacked fins"—are seen as a natural evolutionary step after FinFET devices to move to device structures and a range from 3 nm or even 2 nm. By stacking "sheets" a higher layout efficiency—or current-drive per area—can be arrived at compared to a comparable FinFET technology.

Stacking transistors of different polarity would permit an improved lay-out efficiency, and it would allow for independent optimization of the channels of each device, whereas present silicon-based nanosheet technologies employ the same channel for both n-channel and p-channel devices. Although silicon is optimized for n-FETs, it would be beneficial to enhance the P-FET performance exploiting materials with a higher hole carrier mobility than silicon. Even if SiGe, and not III-V, materials were be used, limitations in etching selectivity between Si and SiGe complicates the processing of heterogeneous channel structures.

Thus, there is a strong interest in the industry in heterogeneous nanosheet processes which may allow for the dense heterogeneous integration of stacked nanosheet n-MOS and p-MOS, a technology which may also be used for TFETs.

The proposed method and specific process steps for forming heterogeneous complementary FETs using a compact stacked nanosheet process are described herein.

The proposed process as well as the resulting device supports actively the replacement of standard FinFET processes to the usage of horizontal nanosheet technology-based devices. This overcomes the hurdle of available nanosheet processes which may not allow dense heterogeneous channel integration, i.e., stacked transistors or FETs of different channel materials. The proposed process also addresses the present limit of using silicon, as has material for p-FETs in n-FET/p-FET stacked device structures, because the mobility of hole carriers in p-FETs may be limited and Silicon-based p-doped channels.

The method and device described herein address successfully the current limitations in etch selectivity between Si and SiGe for the heterogeneous channels.

The usage of the stacked first nanosheet stack and second nanosheet stack with at least two layers of channel material separated by a sacrificial layer, in which the first and the second nanosheet stacks are also separated by another sacrificial layer, may allow different channel materials for the first and the second nanosheet layer, i.e., the first and the second FET in the same device pillar. If the same material may be used for source and drain, heterogeneous and complementary stacked MOSFETs may be fabricated requiring only the space of one device plateauing the way to 3 ns or even 2 ns device structures.

Another advantage may be seen in the fact that no doping implantation is required because the doped contact regions—in particular, the source and drain regions—may be obtained by selective regrowth, preventing the structure from any crystal damages. Some device structures may be extremely sensitive to process and used crystal damages. With the proposed manufacturing method, however, precisely these can be avoided.

In the following, additional embodiments are described.

According to a permissive embodiment of the method, the first source region and the first drain region comprise the same material. In this case, a typical MOSFET structure can be built by the first source region, the first drain region, and the channel material of the first nanosheet stack.

According to another allowable embodiment of the method, the first source region and the first drain region comprise different material. This way, different types of tunnel FETs may be built with the same technology and same process approaches has proposed here. Also, no ion implant process steps are required to grow or regrow the respective source and drain regions.

According to some embodiments the method may also comprise covering surfaces of material of the gate stack with a dielectric layer, e.g., $SiO_2$, $HfO_2$ or $Al_2O_3$ a metal-nitride, deposited by, e.g., ALD (i.e., atomic layer deposition)—such that material of the gate stack is not in contact with any active material, in particular the active channels. Hence, the active channel material is isolated against material of the gate stack allowing a capacitive coupling of the metal gate to the respective channel.

According to some embodiments of the method, one of the first channel material and the channel material may be GaAsSb—i.e., a p-type material—and the other one of the first channel material and the second channel material may be InGaAs, i.e., n-type material.

According to some embodiments of the method, the first channel material and the second channel material are each a mixture of In, Ga, As, and Sb ranging from GaAs to InSb, i.e., $In_vGa_xAs_ySb_z$, in which $v+x+y+z=1$. Hence, a wide variety of different channel materials may be used in the proposed fabrication process and the related device structure.

According to some embodiments of the method, the sacrificial material may be InP. This material may be chosen because of the given etch selectivity if compared to the active channel materials.

According to some embodiments, the method may also comprise depositing an oxide layer on the substrate before forming the first nanosheet stack or the sacrificial layer below the first nanosheet stack. In some embodiments, this optional oxide layer may also take the role of the sacrificial layer below the first nanosheet stack.

According to some embodiments, the method may also comprise removing the material outside a space—in particular, a 3-D space—below a top gate area. This process may reduce the beforehand nanosheet stack to a nine sheet pillar comprising basically the separated first and second nanosheet stack.

According to some embodiments of the method, the first source region and the second source region may be separated by an isolating layer, and the first drain and the second drain may be separated by the isolating layer. This way, two separate stacked FET structures may be built, one over the other. Both FETs may have separate contact regions reaching through a surrounding dielectric.

According to some embodiments of the method—if compared to the embodiment described in the previous paragraph—the first source region and the second source region may be directly connected, and the first drain and the second drain may be directly connected.

Finally, in some embodiments of the stacked nanosheet semiconductor structure, the gate stack surrounding the first channel region and the stack surrounding the second channel region may be separated by an isolating layer. In this way, two separate stacked FET structures may be built, one over the other. Both FETs may have separate contact regions reaching through a surrounding dielectric. This feature may also easily enable implementing inverters.

In the following, a detailed description of the figures will be given. Instructions in the figures are schematic. Firstly, a block diagram of some embodiments of the inventive method for forming heterogeneous complementary FETs using a compact stacked nanosheet process is given. Afterwards, further embodiments, as well as embodiments of the stacked nanosheet semiconductor structure of complementary FETs will be described.

FIG. 1 shows a result 100 of initial method steps of some embodiments of the method for forming heterogeneous complementary FETs using a compact stacked nanosheet process. The figure shows two cross sections. Cross-section 102 shows an area of the substrate 128 from the right side; and cross-section 104 shows a cross-section from the bottom side of the top view 108.

The cross-section 102 shows a sequence of different nanosheet layers on the substrate 128. On the substrate, an optional oxide layer 126 can be deposited. Over the oxide layer 126, a first sacrificial layer 124 is deposited. Then, a first nanosheet stack comprising at two layers 118, 122 of a first channel material are separated by a second sacrificial layer 120.

A second nanosheet stack is shown over the first nanosheet stack. The second nanosheet stack comprises two layers 110, 114 of a second channel material which are separated by the third sacrificial layer 112. The first nanosheet stack and the second nanosheet stack are separated by a fourth sacrificial layer 116. This way, a nanosheet double stack is built in a step-by-step—i.e., layer by layer—process over the substrate 128 and the optional oxide layer 126. The cross-section 104 shows the same sequence of layers 110—i.e., channel material of the second nanosheet stack—down to the substrate 128. The device area 106 of the shown portion 108 as well as the encircled portion shows also a top view of the nanosheet double stack, i.e., a view on the top layer, the channel layer 110. Instead of only two channel layers per first and/or second nanosheet stack, also more channel layers (e.g., typically three) may be used together with an additional sacrificial layer.

FIGS. 2 and 3 show results of further process or method steps according to some embodiments of the method 100. FIG. 2 and the following figures show the same cross sections of the device area 106. Here, a mask layer 202 is deposited on the nanosheet double stack. This becomes visible as a stripe 204 on the encircled top view. Areas of nanosheet double stack outside an area below the stripe are removed (e.g., etched away) so that the cross-section 104 shows only a vertical nanosheet double stack below the mask material 202.

FIG. 3 shows a view 300 of the mask layer 302 limited to the single device area 106 on the encircled top view 108. After etching away areas left and right of the mask layer 202 of the cross-section 102, only the isolated nanosheet double stack 304 is left over, as shown in FIG. 4.

Next, as shown in FIG. 5, areas outside the device area 106 are covered with a dielectric 502, as can be seen in the cross-section 102 and 104 as well as on the encircled top view. The dielectric 502 is deposited on the substrate 128 or the optional oxide layer 126 up to the height of the top surface of the mask layer 202.

FIG. 6 shows some embodiments 600 of building trenches 602 on sides of the nanosheet double stack. These trenches 602 separate the nanosheet double stack including the mask layer 202 down to the oxide layer 126 or the substrate 128 from the dielectric 502 in one dimension, as shown by the cross-section 102. The cross-section 104 of the nanosheet double stack 302 is not affected. This can also be seen on the encircled top view.

FIG. 7 shows a result of another intermediate process step 700 in which first a source 702 and a first drain 704 for the first nanosheet stack are built up (or regrown) on the left and right of the nanosheet double stack 302 in cross-section 102, to at least a height above the substrate 128 or the optional oxide layer at 126 so that a top interface surface of a channel material of the first nanosheet stack is covered. For clarity reasons, the two channel layers 118, 122 of first channel material are again shown with reference numerals. Again, the cross-section 104 is not affected. However, the encircled top view also shows the first source 702 and the first drain 704 as falling diagonally striped areas.

FIG. 8 shows a result 800 of a next process step for building a dielectric layer 802 over the first source 702 and the first drain 704. The encircled top view on the top left side of FIG. 8 shows now in the device area 106 only mask layer 202. As can be seen, the originally wider trenches 602 of FIGS. 6 and 7 have now been narrowed down by building less wide trenches 804, which can also be on the encircled top view. The trenches 804 may be built by filling the trenches 602 (compare FIG. 6 or 7) with the dielectric 502 (or another material), masking the areas of the newly to be built trenches 804 and etch them so that the dielectric separation layer 802 and above the first source 702 and the first drain 704 remains intact. Again, the cross-section 104 is not affected.

FIG. 9 shows a result 900 of building second source 902 and a second drain 904 over the dielectric layer 802 for the second nanosheet stack. The second source 902 and the second drain 904 are built in a way that they are in contact with the channel layers 110, 114 of the first nanosheet stack (compare with FIG. 1). If more than two channels 110, 114 have been built before as active layers in the first nanosheet stack, the higher number of channels in the nanosheet stack should be in contact with the second source 902 and the second drain 904. The second source 902 and the second rain 904 are also visible in the encircled top view as vertically striped areas in the dielectric 502 left and right mask area 202.

FIG. 10 shows a result 1000 of a next process step of closing the dielectric 502 over the second source 902 and the second drain 904. Again, the cross-section 104 is not affected by this process step.

FIG. 11 shows a result 1100 of one or more next process steps of a removal of the sacrificial layers and replacing it by a gate stack. Furthermore, metal contacts 1102, 1104 are built through the dielectric 502 to stay in electrical contact with the first source 702, the second drain 902, the first drain 704, as well as the second drain 904.

The cross-section 104 as well as the cross-section 102 shows each a different layout of the nanosheet double stack 1106. Now, the former sacrificial layers (shown up to FIG. 10 as rising diagonal stripes) have been replaced by a gate stack, typically a metal gate stack, in a gate-all-around fashion around the white channel material of the first and the second nanosheet shown as a combined nanosheet double stack 1106. For this, the channel materials of the first and the second nanosheet stack (i.e., layers 110, 114, 118, 122, compare with FIG. 1) have been covered by a dielectric material in order to allow a capacitive coupling of the metallic gate stack.

The former cover mask layer 122 can now be replaced by a top metal contact 1108 if that is not already the case. Additionally, the metal contacts 1102, 1104 and 1108 are shown in the encircled upper left view as horizontally striped areas in the dielectric 502. Additionally, the gate stack covers all sides of all the channels as shown in the cross section 104 in FIG. 11, i.e., also the sidewalls of the channel stack (compare with 1204 below). This is in contrast to FIG. 12, where the gate for the lower transistor is separated from the upper transistor.

Because the material of the first channel layers of the first nanosheet stack and the material of the second channel layers of the second nanosheet stack are doped differently or are different materials, heterogeneous, complementary FETs using the just described compact stack nanosheet process can be built.

Certain additional standard process steps for fabricating semiconductor devices may be required but which have been left out in the description for conciseness and comprehensibility reasons. A skilled person will know the required masking, covering, etching and other techniques typically used to build the different layers and structures, as described above. This may also apply to potentially required vertical or horizontal spacers in parts of the above described process sequence. Here, only relevant example steps are shown, whereas an actual fabrication contain numerous process steps aimed at optimizing different device properties, which are not included here for simplicity—such as internal and external spacers, a silicidation process, strain-inducing steps, etc. These may also be employed. Furthermore, the order of different process steps may be performed in a different sequence than described where appropriate.

It is possible to exchange the positions of the second source 902 and the second drain 904 so that the second source 902 is positioned above the first drain 704 and so that the second drain 904 is positioned above the first source 702. In addition, it is quite possible to omit the dielectric layer 806 between the source and drain of the first FET and the second FET so that the first source 702 and the second source 902 are in direct contact with one another. The same may be applied to the first drain 704 and the second drain 904. In such a case, only one metal instead of two contacts 1102, 1104 through the dielectric 502 may be required.

FIG. 12 shows an alternative embodiment 1200 with separated source and drain regions for the transistors. The insulation layer 1202 ensures that the respective source and drain regions are not connected to each other. Hence completely independent stacked transistors can be implemented. Not shown is a connection from the lower the gate layer to the surface of the device. The cross-section 104 now also shows the additional insulating layer 1202 in the nanosheet stack so that below and above the additional insulating or separation layer 1202 gate separate layers for the upper gate stack and the lower gate stack are isolated against each other. In order to achieve this structure, the isolating layer 1202 should be deposited in the very beginning of the process steps, i.e., as part of the starting nanosheet stack as shown in FIG. 1.

FIG. 13 shows a flow of some embodiments of the inventive method 1300 for forming heterogeneous complementary FETs using a compact stacked nanosheet process. The method 1300 comprises at least forming 1302, on a first sacrificial layer and over a substrate, e.g., Si, a first nanosheet stack comprising two layers of a first channel material separated by a second sacrificial layer. More than two layers of the first general material are also possible. The general concept may also work with only one layer for the first channel material. However, it can be expected that the efficiency of the resulting devise may be significantly higher with at least two channel layers.

The method 1300 also comprises forming 1304, over the first nanosheet stack a second nanosheet stack comprising two layers of a second channel material separated by a third sacrificial layer, thereby building a nanosheet double stack. Thereby, a fourth sacrificial layer separates the first and the second nanosheet stack. Additionally, the first channel material is complementary to the second channel material, i.e., p-doped vs. n-doped or material of opposing polarity.

Furthermore, the method 1300 comprises forming 1306, a first source region and a first drain region, both being in contact with the two layers—in particular at opposite ends of the channel material—of a first channel material, thereby building a first FET.

Additionally, the method 1300 comprises forming 1308, over the first source region and the first drain region, a second source region and a second drain region, both being in contact with the at least two layers of a second channel material. Thereby, a second FET is built over the first FET. The second source region is positioned over the first source region—in particular, separated by an isolating (dielectric) layer. Also, the second drain is positioned over the first drain region, in particular also separated by the isolating (dielectric) layer.

Moreover, the method 1300 comprises removing selectively 1310, the first, the second, the third and the fourth sacrificial layer by an etch process that is selective to the material of the first channel material and the second channel material, and that is not selective to the first, the second and the third sacrificial layer, and forming 1312, a gate stack—in particular, a metal gate stack replacing potentially previously built dummy gate layers—comprising a gate-all-around structure around all channels of both, the first FET and the second FET.

As semiconductor material for the channels, differently doped Si, SiGe and/or Ge may be used. Furthermore, all suitable combinations of III-V compound materials like $In_{1-x}Ga_xIn$, GaN, InP, InGaSB, InAs, $GaAs_xSb_{1-x}$ may be used. As material for the dummy gate structure, amorphous Silicon, Silicon oxide and/or Silicon nitride may be used. Finally, the material of the substrate may be Silicon or a III-V layer material. The original material stack consisting of both channels materials and sacrificial material may be grown directly on the device substrate, or transferred by wafer bonding from another growth substrate.

The flowcharts and/or block diagrams in the figures illustrate the architecture, functionality, and operation of possible implementations of systems and methods according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms 'a', 'an' and 'the' are intended to include the plural forms as well, unless the context clearly indicates otherwise. It will further be understood that the terms comprises and/or comprising, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method for forming heterogeneous complementary FETs using a compact stacked nanosheet process, the method comprising:
   forming, on a first sacrificial layer and over a substrate, a first nanosheet stack comprising two layers made of a first channel material separated by a second sacrificial layer;
   forming, over the first nanosheet stack, a second nanosheet stack comprising two layers made of a second channel material separated by a third sacrificial layer, wherein the first nanosheet stack and the second nanosheet stack form a nanosheet double stack;
   wherein a fourth sacrificial layer separates the first and the second nanosheet stack, and wherein the first channel material is complementary to the second channel material;
   forming a first source region and a first drain region, both being in direct contact with the two layers of the first channel material and the first and second sacrificial layer to build a first FET;

forming, over the first source region and the first drain region, a second source region and a second drain region, both being in direct contact with the two layers of the second channel material and the third and fourth sacrificial layer to build a second FET;
wherein:
the second source region is positioned over the first source region;
the second drain is positioned over the first drain region; and
at least one of the following two elements is true:
the first source and the second source are in direct contact; and
the first drain and the second drain are in direct contact;
the method further comprising:
removing, selectively, the first, the second, the third, and the fourth sacrificial layer by an etch process that is selective to the material of the first channel material and the second channel material, and that is not selective to the first, the second and the third sacrificial layer; and
forming a gate stack comprising a gate-all-around structure around the channels that replace the first, second, third, and fourth sacrificial layer;
wherein:
only one or none of the following two elements is true:
the first source region and the second source region are separated by an isolating layer;
the first drain and the second drain are separated by the isolating layer; and
further wherein:
the first nanosheet stack and the second nanosheet stack are separated by the isolating layer.

2. The method according to claim 1, wherein the first source region and the first drain region comprise the same material.

3. The method according to claim 1, wherein the first source region and the first drain region comprise different materials.

4. The method according to claim 1, further comprising covering surfaces of material of the gate stack with a dielectric layer such that is not in contact with any active material.

5. The method according to claim 1, wherein one of the first channel material and the second channel material is GaAsSb and wherein the other one of the first channel material and the second channel material is InGaAs.

6. The method according to claim 1, wherein the first channel material and the second channel material is each a mixture of In, Ga, As and Sb ranging from GaAs to InSb.

7. The method according to claim 1, wherein the sacrificial material is InP.

8. The method according to claim 1, further comprising depositing an oxide layer on the substrate before forming the first nanosheet stack.

9. The method according to claim 1, further comprising removing the material outside a space below a top gate area.

10. The method according to claim 1, wherein the gate stack is a metal gate stack.

11. A stacked nanosheet semiconductor structure of complementary FETs, the structure comprising:
a first nanosheet stack comprising two layers of a first channel material over a substrate, wherein the two channel layers are surrounded by a gate-all-around structure;
a second nanosheet stack over the first nanosheet stack, the second nanosheet stack comprising two layers of a second channel material that builds a nanosheet double stack;
wherein the first channel material is complementary to the second channel material;
a first source region and a first drain region, both being in direct contact with the two layers of a first channel material that builds a first FET and a gate stack material that replaces first and second sacrificial layers;
a second source region over the first source region and a second drain region over the first drain region, respectively, both being in direct contact with the two layers of a second channel material that builds a second FET and the gate stack material that replaces third and fourth sacrificial layers; and
a gate stack comprising the gate-all-around structure around the channels;
wherein:
at least one of the following two elements is true:
the first source and the second source are in direct contact; and
the first drain and the second drain are in direct contact; and
only one or none of the following two elements is true;
the first source region and the second source region are separated by an isolating layer; and
the first drain and the second drain are separated by the isolating layer; and
the first nanosheet stack and the second nanosheet stack are separated by the isolating layer.

12. The structure according to claim 11, wherein the first source region and the first drain region comprise a same material.

13. The structure according to claim 11, wherein the first source region and the first drain region comprise different materials.

14. The structure according to claim 11, wherein one of the first channel material and the second channel material is GaAsSb and wherein the other one of the first channel material and the second channel material is InGaAs.

15. The structure according to claim 11, wherein the first channel material and the second channel material are each a mixture of In, Ga, As and Sb ranging from GaAs to InSb.

16. The structure according to claim 11, wherein the gate stack surrounding the first channel region and the stack surrounding the second channel region are separated by an isolating layer.

17. The structure according to claim 11, further comprising an oxide layer below the first nanosheet stack.

18. The structure according to claim 11, wherein the gate stack material is a metal gate stack material.

* * * * *

UNITED STATES PATENT AND TRADEMARK OFFICE
CERTIFICATE OF CORRECTION

| | |
|---|---|
| PATENT NO. | : 11,735,634 B2 |
| APPLICATION NO. | : 17/203971 |
| DATED | : August 22, 2023 |
| INVENTOR(S) | : Cezar Bogdan Zota, Clarissa Convertino and Kirsten Emilie Moselund |

It is certified that error appears in the above-identified patent and that said Letters Patent is hereby corrected as shown below:

On the Title Page

Inventor name should be Bogdan Cezar Zota name (was Cezar Bogdan Zota)

Signed and Sealed this
Twelfth Day of November, 2024

Katherine Kelly Vidal
*Director of the United States Patent and Trademark Office*